(12) United States Patent
Lall et al.

(10) Patent No.: US 7,033,873 B1
(45) Date of Patent: Apr. 25, 2006

(54) METHODS OF CONTROLLING GATE ELECTRODE DOPING, AND SYSTEMS FOR ACCOMPLISHING SAME

(75) Inventors: Pirainder Lall, Austin, TX (US); Eric O. Green, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 219 days.

(21) Appl. No.: 10/246,572

(22) Filed: Sep. 18, 2002

(51) Int. Cl.
*H01L 21/338* (2006.01)
*G01R 31/26* (2006.01)

(52) U.S. Cl. .......................... 438/174; 438/14; 438/16

(58) Field of Classification Search ................. 438/14, 438/301, 563, 487, 685, 585, 174; 324/224; 357/30; 257/364, 607
See application file for complete search history.

(56) References Cited

U.S. PATENT DOCUMENTS

| | | | | |
|---|---|---|---|---|
| 4,866,500 A * | 9/1989 | Nishizawa et al. | ......... | 257/114 |
| 4,914,043 A * | 4/1990 | Nishizawa et al. | ........... | 438/59 |
| 4,996,577 A * | 2/1991 | Kinzer | ........................ | 257/82 |
| 5,316,977 A * | 5/1994 | Kunishima et al. | ......... | 438/558 |
| 5,354,710 A * | 10/1994 | Kawaguchi et al. | ........ | 438/561 |
| 5,367,190 A * | 11/1994 | Funaki | ........................ | 257/607 |
| 5,444,284 A * | 8/1995 | Funaki | ........................ | 257/364 |
| 5,496,768 A * | 3/1996 | Kudo | ........................... | 438/487 |
| 5,683,569 A * | 11/1997 | Chung et al. | ................ | 205/775 |
| 5,895,259 A * | 4/1999 | Carter et al. | ................. | 438/563 |
| 6,033,922 A * | 3/2000 | Rowland et al. | .............. | 438/14 |
| 6,197,646 B1 * | 3/2001 | Goto et al. | ................... | 438/301 |
| 6,295,630 B1 * | 9/2001 | Tamegaya | ....................... | 716/4 |
| 6,462,538 B1 * | 10/2002 | Harada | ........................ | 324/224 |
| 2001/0010967 A1 * | 8/2001 | Chen | ........................... | 438/585 |
| 2003/0060092 A1 * | 3/2003 | Johnson et al. | ............. | 439/894 |
| 2003/0228724 A1 * | 12/2003 | Koyama | ...................... | 438/174 |

* cited by examiner

*Primary Examiner*—Michael Lebentritt
*Assistant Examiner*—Andre' Stevenson
(74) *Attorney, Agent, or Firm*—Williams, Morgan & Amerson P.C.

(57) ABSTRACT

The present invention is generally directed to various methods of controlling gate electrode doping, and various systems for accomplishing same. In one illustrative embodiment, the method disclosed herein comprises performing at least one process operation to form a doped layer of gate electrode material, measuring a sheet resistance of the doped layer of gate electrode material and adjusting at least one parameter of at least one process if the measured sheet resistance does not fall within acceptable limits. In one embodiment, the system is comprised of a process tool for performing at least one process operation to form a doped layer of gate electrode material, a metrology tool for measuring a sheet resistance of the doped layer of gate electrode material and a controller for adjusting at least one parameter of at least one process operation if the measured sheet resistance of the doped layer of gate electrode material does not fall within acceptable limits.

15 Claims, 3 Drawing Sheets

METHODS OF CONTROLLING GATE ELECTRODE DOPING, AND SYSTEMS FOR ACCOMPLISHING SAME

BACKGROUND OF THE INVENTION

1. Field of the Invention

This invention relates generally to semiconductor fabrication technology, and, more particularly, to various methods of controlling gate electrode doping, and systems for accomplishing same.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

By way of background, an illustrative field effect transistor is typically formed above a surface of a semiconducting substrate or wafer comprised of doped silicon. The substrate may be doped with either N-type or P-type dopant materials. The transistor typically has a doped polycrystalline silicon (polysilicon) gate electrode formed above a gate insulation layer comprised of, for example, silicon dioxide. The gate electrode and the gate insulation layer may be separated from doped source/drain regions of the transistor by a dielectric sidewall spacer. The source/drain regions of the transistor may be formed by performing one or more ion implantation processes to introduce dopant atoms, e.g., arsenic or phosphorous for NMOS devices, boron for PMOS devices, into the substrate. Shallow trench isolation regions may be provided to isolate the transistor electrically from neighboring semiconductor devices, such as other transistors.

In the process of forming integrated circuit devices, millions of transistors are formed above a semiconducting substrate. In general, semiconductor manufacturing operations involve, among other things, the formation of layers of various materials, e.g., polysilicon, insulating materials, metals, etc., and the selective removal of portions of those layers by performing known photolithographic and etching techniques. These processes, along with various ion implant and heating processes, are continued until such time as the integrated circuit device is complete. Additionally, a typical integrated circuit device is comprised of a plurality of conductive interconnections, such as conductive lines and conductive contacts or vias, positioned in multiple layers of insulating material formed above the substrate. These conductive interconnections allow electrical signals to propagate between the transistors formed above the substrate.

Moreover, there is a constant effort to increase the yield of the manufacturing processes used to form the integrated circuit devices. In turn, this involves manufacturing transistors, and the various components thereof, e.g., the gate insulation layer, the gate electrode, etc., in accordance with very precise design requirements. As device performance continues to be driven toward greater operating speeds, optimizing every facet of manufacturing integrated circuit devices is important to improve yields. This is even more important in the field of manufacturing integrated circuits where there is also great pressure to reduce manufacturing costs while delivering devices with the desired performance capabilities.

The present invention is directed to overcoming, or at least reducing the effects of, one or more of the problems described above.

SUMMARY OF THE INVENTION

The present invention is generally directed to various methods of controlling gate electrode doping. In one illustrative embodiment, the method disclosed herein comprises performing at least one process operation to form a doped layer of gate electrode material, measuring a sheet resistance of the doped layer of gate electrode material and adjusting at least one parameter of at least one process if the measured sheet resistance does not fall within acceptable limits.

In another illustrative embodiment, the method comprises performing at least one diffusion process operation to form a doped layer of gate electrode material, measuring a sheet resistance of the doped layer of gate electrode material and adjusting at least one parameter of the at least one diffusion process if said measured sheet resistance does not fall within acceptable limits.

In yet another illustrative embodiment, the method comprises performing at least one ion implant process operation to form a doped layer of gate electrode material, measuring a sheet resistance of the doped layer of gate electrode material and adjusting at least one parameter of the at least one ion implant process if said measured sheet resistance does not fall within acceptable limits.

In a further illustrative embodiment, the method comprises performing at least one deposition process in a deposition chamber while introducing dopant material therein to form a doped layer of gate electrode material, measuring a sheet resistance of the doped layer of gate electrode material and adjusting at least one parameter of the at least one deposition process if the measured sheet resistance does not fall within acceptable limits.

The present invention is also directed to various systems that may be used to perform the methods described herein. In one embodiment, the system is comprised of a process tool for performing at least one process operation to form a doped layer of gate electrode material, a metrology tool for measuring a sheet resistance of the doped layer of gate electrode material and a controller for adjusting at least one parameter of at least one process operation if the measured sheet resistance of the doped layer of gate electrode material does not fall within acceptable limits.

In another illustrative embodiment, the system comprises a furnace for performing at least one heating process to introduce dopant atoms into a doped layer of gate electrode material by a diffusion process, a metrology tool for measuring a sheet resistance of the doped layer of gate electrode material and a controller for adjusting at least one parameter of the at least one heating process if the measured sheet resistance of the doped layer of gate electrode material does not fall within acceptable limits.

In yet another illustrative embodiment, the system comprises an ion implant tool for performing at least one ion implant process operation to form a doped layer of gate electrode material, a metrology tool for measuring a sheet resistance of the doped layer of gate electrode material and a controller for adjusting at least one parameter of the at least one ion implant process operation if the measured sheet resistance of the doped layer of gate electrode material does not fall within acceptable limits.

In a further illustrative embodiment, the system comprises a deposition tool adapted to perform a deposition process while dopant atoms are introduced into the deposition tool to thereby form a doped layer of gate electrode material, a metrology tool for measuring a sheet resistance of the doped layer of gate electrode material and a controller for adjusting at least one parameter of the deposition process if said measured sheet resistance of the doped layer of gate electrode material does not fall within acceptable limits.

BRIEF DESCRIPTION OF THE DRAWINGS

The invention may be understood by reference to the following description taken in conjunction with the accompanying drawings, in which like reference numerals identify like elements, and in which.

Figure 1:
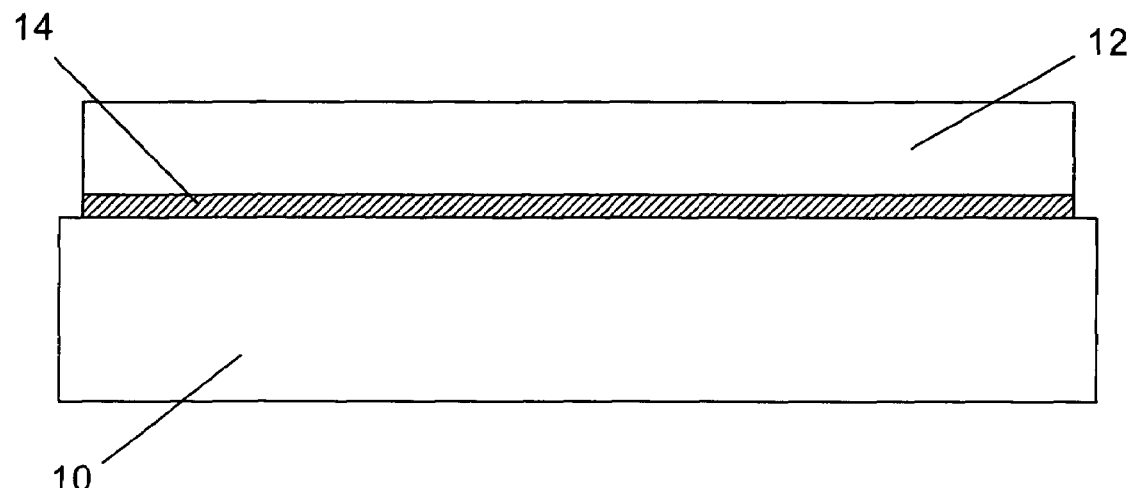
FIG. 1 is a cross-sectional view of an illustrative layer of gate electrode material formed above a semiconducting substrate.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and structures depicted in the drawings may be exaggerated or reduced as compared to the size of those features or structures on real-word devices or systems. Moreover, for purposes of clarity, the illustrative system depicted herein does not include all of the supporting utilities and devices of such a system. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present invention is directed to various methods of controlling gate electrode doping, and various systems for accomplishing same. As will be readily apparent to those skilled in the art upon a complete reading of the present application, the present methods and systems are applicable to a variety of technologies, e.g., NMOS, PMOS, CMOS, etc., and they are readily applicable to the formation of a variety of devices, including, but not limited to, logic devices, memory devices, etc.

FIG. 1 is a cross-sectional view of an illustrative substrate 10 having a layer of gate electrode material 12 formed thereabove. A layer of insulating material 14 is positioned between the gate electrode material 12 and the substrate 10. The gate electrode material 12 and the layer of insulating material 14 may be comprised of a variety of different materials, and they may be formed using a variety of different techniques. For example, the layer of gate electrode material 12 may be comprised of polysilicon, it may have a thickness ranging from approximately 85–300 nm, and it may be formed by a variety of different processes, e.g., chemical vapor deposition (CVD), low pressure chemical vapor deposition (LPCVD), etc. The layer of insulating material 14 may be comprised of, for example, silicon dioxide, it may have a thickness ranging from approximately 2–5 nm, and it may be formed by a thermal growth process or by a deposition process. The substrate 10 may be comprised of a variety of semiconducting materials, such as silicon or germanium, and it is also intended to be representative of structures such as silicon-on-insulator (SOI) structures, etc. As will be understood by those skilled in the art after a complete reading of the present application, the present invention has broad applicability to a variety of devices. Thus, the present invention should not be considered as limited to the particular materials and thickness limitations disclosed and discussed for the substrate 10, the layer of insulating material 14 and the layer of gate electrode material 12 unless such limitations are expressly set forth in the appended claims.

Ultimately, the layer of gate electrode material 12 will be patterned using known photolithography and etching techniques to define a plurality of gate electrode structures for a plurality of transistors to be formed above the substrate 10. After patterning the gate electrode layer 12, additional process operations will be performed for a variety of purposes, e.g., to form source/drain regions for the device, to form metal silicide regions on the gate electrode and source/drain regions, to form sidewall spacers adjacent the gate electrode structures, etc.

Dopant materials are introduced into the layer of gate electrode material 12 to, among other things, increase the conductivity of the resulting gate electrode structures on the finished transistor devices. This is important in that the increased conductivity of the gate electrode structures allows the transistors to operate at faster switching speeds. One parameter of interest with respect to the gate electrode material 12 and the resulting gate electrode structures is the sheet resistant ($R_S$) of the layer of material 12 after dopant materials are introduced into the layer of gate electrode material 12. This parameter may have an impact on one or more electrical performance characteristics of the final transistor device.

A variety of dopant materials may be introduced into the layer of gate electrode material 12, and it may be accomplished using a variety of techniques. For example, for NMOS devices, an N-type dopant material, such as phosphorous or arsenic, may be introduced into the layer of gate electrode material 12. For PMOS devices, a variety of P-type dopant materials, such as boron or boron difluoride, may be introduced into the layer of gate electrode material 12. The dopants may be introduced by a variety of techniques. For example, the dopant atoms may be introduced by a diffusion process, an ion implant process, and/or by introducing dopants during the deposition process used to form the layer of gate electrode material 12.

Figure 2:
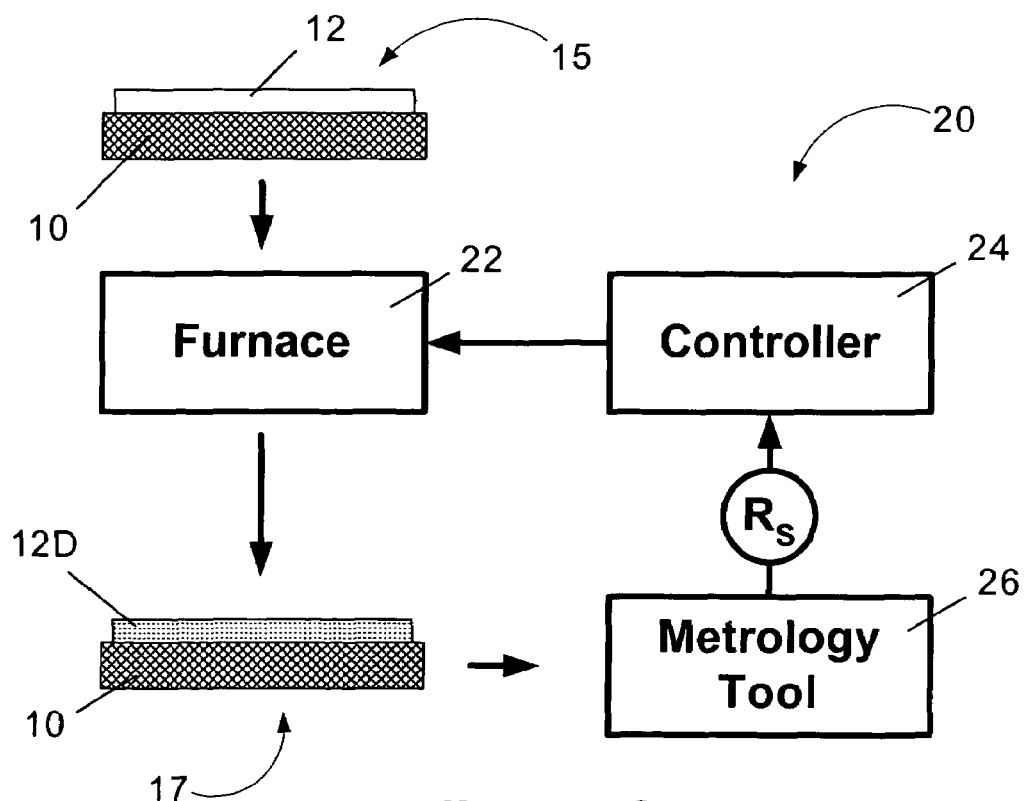
FIG. 2 is one illustrative embodiment of a system that may be employed in one aspect of the present invention.

FIG. 2 is an illustrative embodiment of a system 20 wherein a diffusion process will be used to introduce the desired dopant atoms into the layer of gate electrode material 12. As shown therein, the system 20 is comprised of a furnace 22, a controller 24 and a metrology tool 26. An illustrative substrate 10, having a layer of gate electrode material 12, is provided to the furnace 22. A dopant source, e.g., a gas, is introduced into the furnace 22 and one or more heating processes are performed to cause the dopant materials to diffuse into the layer of gate electrode material 12. This processing results in a doped layer of gate electrode material 12D.

The process(es) performed in the furnace 22 may vary depending upon the particular devices under construction. In one illustrative embodiment, a two-step heating process is performed to introduce and drive the dopant atoms into the layer of gate electrode material 12. For example, for NMOS devices, a source gas, such as phosphorous chloride (POCL) may be introduced into the furnace 22 and an initial heat treatment may be performed at a temperature ranging from approximately 500–1100° C. for a duration ranging from approximately 5–120 minutes. Of course, other source gases may be employed. After the initial heat treating process is performed, a second heat treating process is performed to drive the dopant materials diffused into the layer of gate electrode material 12 during the initial heat treatment deeper into the layer of gate electrode material 12. The parameters of this second heat treatment may also vary depending upon the devices under construction. In one illustrative embodiment, the second heat treating process is performed at a temperature ranging from approximately 500–1100° C. for a duration of approximately 5–120 minutes. In some cases, a single heat treatment process may be performed to accomplish both purposes. In one particularly illustrative example where POCL is employed, a first heat treatment process may be performed at a temperature of about 900° C. for 5–90 minutes to introduce dopants into the gate electrode material layer 12, and a second heat treatment process may be performed at a temperature of approximately 900° C. for a duration of about 5–90 minutes to drive the dopant material into the gate electrode material layer 12. In some cases, a single heat treatment process may be performed to accomplish the induction and drive-in of the dopant material.

After processing one or more of the incoming substrates 15 in the furnace 22, one or more of the processed substrates 17, with dopants introduced into the doped layer of gate electrode material 12D, are provided to the metrology tool 26, as indicated in FIG. 2. The metrology tool 26 may be any type of metrology tool capable of measuring or determining the sheet resistance ($R_S$) of the doped layer of gate electrode material 12D. In one illustrative embodiment, the metrology tool 26 is a four-point probe sold by Prametrix. The number of substrates measured may be varied as a matter of choice. For example, a preselected number of substrates from each lot processed in the furnace 22 may be measured in the metrology tool 26 to determine the sheet resistance ($R_S$) of the doped layer of gate electrode material 12D. Alternatively, an arbitrary selection rate may be established for measuring the sheet resistance ($R_S$), e.g., every $10^{th}$ or $30^{th}$ substrate processed in the furnace 22. Whatever sampling scheme is selected, it should be such that there is reasonable expectation that the measured results reflect the process performed in the furnace 22 in terms of introducing and distributing the desired amount of dopant material into the doped layer of gate electrode material 12D. If a plurality of measurements are taken, the data may be averaged or otherwise statistically compiled and manipulated if desired.

The measured value(s) for the sheet resistivity ($R_S$) of the doped layer of gate electrode material 12D is provided to the controller 24. Based upon this measured sheet resistivity ($R_S$), the controller 24 may control or adjust one or more parameters of the processes performed in the furnace 22 to drive the process toward a desired or target value, or range of values, of the sheet resistance ($R_S$) for doped layers of gate electrode material 12D produced by the processes performed in the furnace 22. In short, a feedback control loop may be created such that the processes performed in the furnace 22 are producing doped layers of gate electrode material 12D in accordance with a preselected target value for sheet resistance ($R_S$), or at least within an acceptable range of target values.

The controller 24 may control one or more parameters of the process operations performed in the furnace 22. For example, the controller 24 may control the duration of one or more heat treatment processes, the temperature of one or more heat treatment processes, the number of heat treating processes performed in the furnace 22, the type of sources gases used in the furnace 22, the flow rate or composition of process gases or dopant source gases used in the furnace 22, a location or placement of the wafers in the furnace or process chamber, etc. By way of example, if the sheet resistance ($R_S$) measured by the metrology tool 26 indicates that the sheet resistance ($R_S$) is above a preselected value or range of acceptable values, the duration of one or more of the heat treating processes performed in the furnace 22 may be increased in an effort to increase the dopant concentration and/or distribution of the dopant material within the doped layer of gate electrode material 12D. Alternatively, or additionally, the temperature of one or more of the heat treating processes may also be increased.

Figure 3:
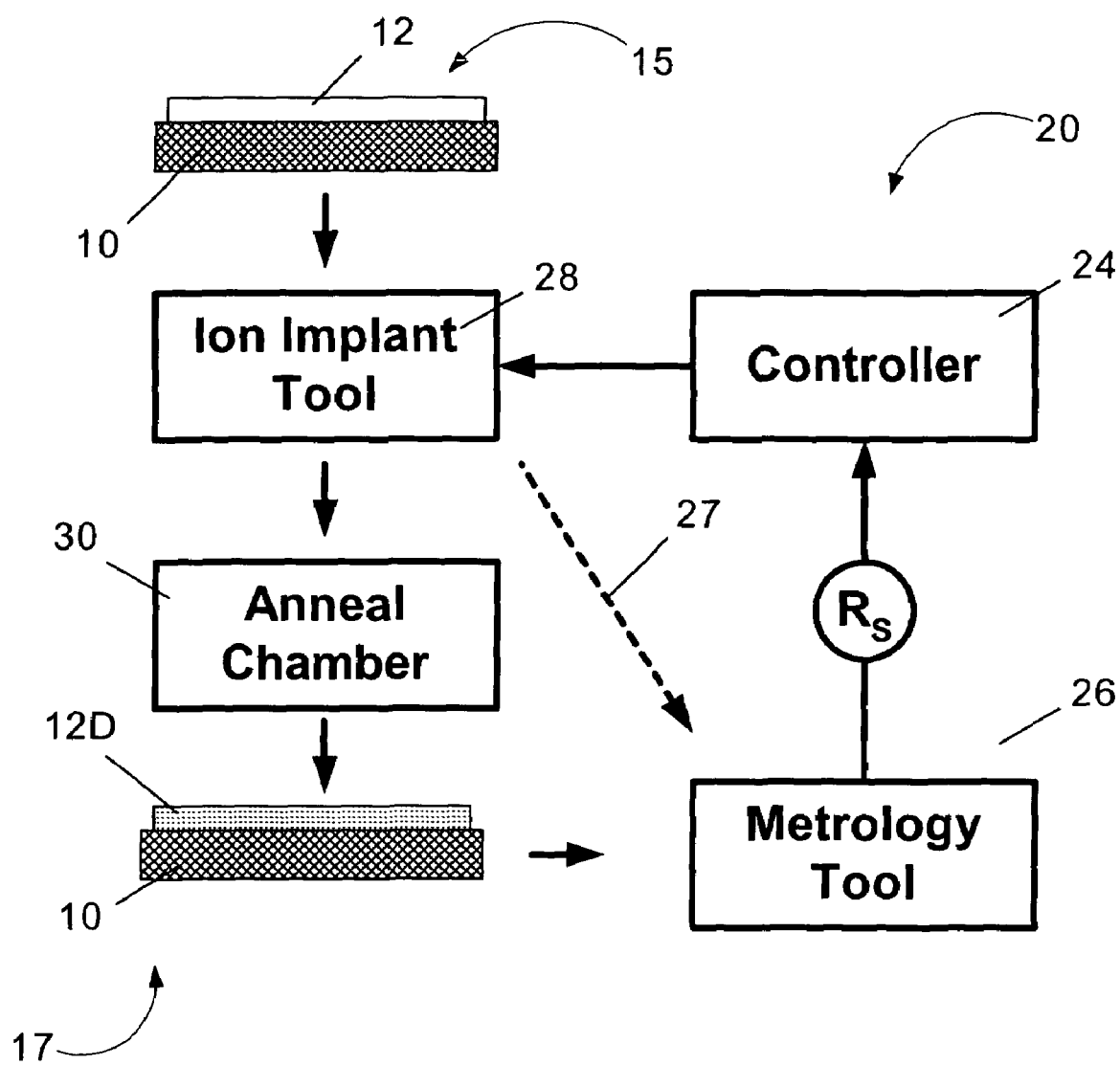
FIG. 3 is another illustrative embodiment of a system that may be employed with another aspect of the present invention.

FIG. 3 is an alternative embodiment of a system 20 in which the present invention may also be practiced. In this embodiment, dopant materials are introduced into the layer of gate electrode material 12 by performing at least one ion implant process. Accordingly, the system 20 depicted in FIG. 3 is comprised of the controller 24, the metrology tool 26 and an ion implant tool 28. The system 20 in FIG. 3 may also comprise an anneal chamber 30. The ion implant tool 28 may be any type of ion implant tool useful for introducing dopant atoms into a layer of material. The type of dopant atoms implanted, the dopant dose and the energy level of the ion implant process performed in the ion implant tool 28 may vary depending upon the particular devices under construction. In some embodiments, a heat treatment process may be performed on substrates in the anneal chamber 30 after the ion implantation step is performed. The anneal chamber 30 may be a traditional furnace or a rapid thermal anneal tool. In the case where an anneal process is performed after the ion implantation process is performed, it may be performed at a temperature of approximately 800–1200° C. for a duration of approximately 10–90 minutes. In some cases, an anneal process may not be required after performing the ion implantation process, as indicated by the dashed line 27 that bypasses the anneal chamber 30. Moreover, in some cases, the anneal processes may actually be part of subsequent processes performed on the device at later stages of fabrication.

Under either scenario, after the doped layer of gate electrode material 12D is formed, it is provided to the metrology tool 26 where sheet resistance ($R_S$) measurements are obtained and provided to the controller 24, as described before. The controller 24 may control or adjust one or more of the parameters of the processes performed in the ion implant tool 28 and/or the anneal chamber 30 if the measured sheet resistance ($R_S$) does not meet limitations set for the sheet resistance or an acceptable range of values for the sheet resistance ($R_S$). For example, the controller 24 may control or adjust the dopant dose and/or implant energy of the ion implant process performed in the ion implant tool 28. Alternatively, or additionally, the controller 24 may control or adjust the temperature or duration of the anneal process performed in the anneal chamber 30. As before, the feedback control loop depicted in FIG. 3 may be used to insure that the system 20 depicted therein is providing doped layers of gate electrode material 12D having acceptable sheet resistance ($R_S$) values.

Figure 4:
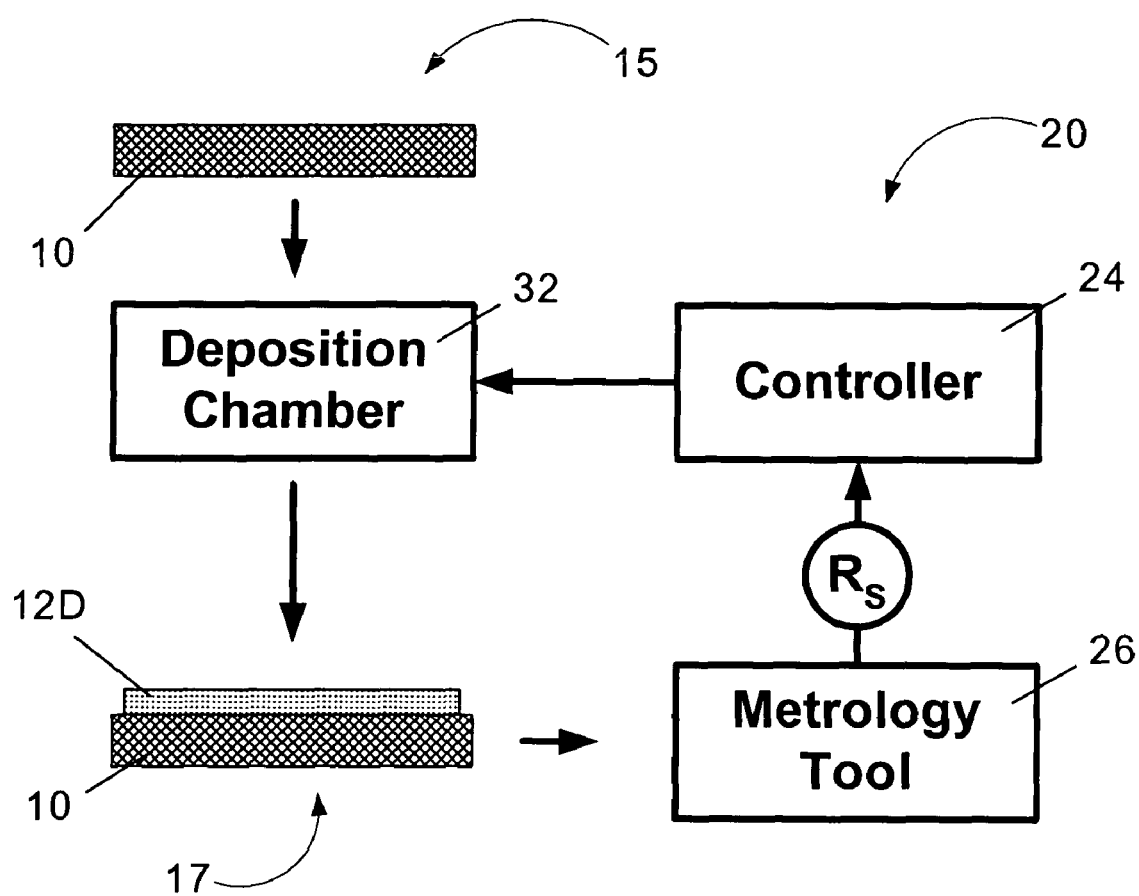
FIG. 4 is yet another illustrative embodiment of another illustrative system that may be employed with the present invention.

FIG. 4 depicts yet another illustrative embodiment of the present invention, wherein dopant atoms are introduced into a layer of gate electrode material 12 during the deposition process used to form the layer of gate electrode material 12. Accordingly, the system 20 depicted in FIG. 4 is comprised of the controller 24, the metrology tool 26 and a deposition chamber 32. The deposition chamber 32 may be any type of deposition tool capable of forming a layer of gate electrode material 12. Any of a variety of deposition processes may be performed in the deposition chamber 32 to form the layer of gate electrode material, e.g., chemical vapor deposition (CVD), low pressure chemical vapor deposition (LPCVD), etc.

In general, as indicated in FIG. 4, a substrate 10 is provided to the deposition chamber 32. During the deposition process performed in the deposition chamber 32, dopant atoms are introduced into the deposition chamber 32 such that the end result of the deposition process is a doped layer of gate electrode material 12D formed above the substrate 10. The dopant material may be introduced into the deposition chamber 32 by introducing one or more source gases into the deposition chamber 32. For example, source gases such as phosphine (for N-type dopants) may be introduced into the deposition chamber 32 during the deposition process. Moreover, the source gases may be introduced on a continuous or intermittent basis. After the doped layer of gate electrode material 12D is formed, an anneal process may be performed. As before, this may be a separate anneal process or it may be performed as part of subsequent anneal processes performed on the wafer.

Once the system 20 of FIG. 4 is used to form the doped layer of gate electrode material 12D, the metrology tool 26 is used to obtain values for the sheet resistance ($R_S$) of that layer, and the measured sheet resistance ($R_S$) values are provided to the controller 24. If the measured sheet resistance values do not fall within acceptable limits, the controller 24 may control one or more parameters of the deposition process performed in the deposition chamber 32. For example, the controller 24 may control or adjust the temperature, pressure or duration of the deposition process or the composition or flow rate of the various processes and dopant source gases supplied to the deposition chamber 32 in an effort to insure that subsequently formed doped layers of gate electrode material 12D produced by the deposition chamber 32 have sheet resistance ($R_S$) values that are within acceptable limits.

In the illustrated embodiments, the controller 24 is a computer programmed with software to implement the functions described herein. Moreover, the functions described for the controller 24 may be performed by one or more controllers spread through the system. For example, the controller 24 may be a fab level controller that is used to control processing operations throughout all or a portion of a semiconductor manufacturing facility. Alternatively, the controller 24 may be a lower level computer that controls only portions or cells of the manufacturing facility. Moreover, the controller 24 may be a stand-alone device, or it may reside on the furnace 22, the ion implant tool 28 and/or the deposition tool 32, depending upon the particular application. However, as will be appreciated by those of ordinary skill in the art, a hardware controller (not shown) designed to implement the particular functions may also be used.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 24, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699 —Provisional Specification for CIM Framework Domain Architecture) and APC (SEMI E93-0999—Provisional Specification for CIM Framework Advanced Process Control Component) specifications are publicly available from SEMI.

The present invention is generally directed to various methods of controlling gate electrode doping. In one illustrative embodiment, the method disclosed herein comprises performing at least one process operation to form a doped layer of gate electrode material, measuring a sheet resistance of the doped layer of gate electrode material and adjusting at least one parameter of at least one process if the measured sheet resistance does not fall within acceptable limits.

In another illustrative embodiment, the method comprises performing at least one diffusion process operation to form a doped layer of gate electrode material, measuring a sheet resistance of the doped layer of gate electrode material and adjusting at least one parameter of the at least one diffusion process if said measured sheet resistance does not fall within acceptable limits.

In yet another illustrative embodiment, the method comprises performing at least one ion implant process operation to form a doped layer of gate electrode material, measuring a sheet resistance of the doped layer of gate electrode material and adjusting at least one parameter of the at least one ion implant process if said measured sheet resistance does not fall within acceptable limits.

In a further illustrative embodiment, the method comprises performing at least one deposition process in a deposition chamber while introducing dopant material therein to form a doped layer of gate electrode material, measuring a sheet resistance of the doped layer of gate electrode material and adjusting at least one parameter of the at least one deposition process if the measured sheet resistance does not fall within acceptable limits.

The present invention is also directed to various systems that may be used to perform the methods described herein. In one embodiment, the system is comprised of a process tool for performing at least one process operation to form a doped layer of gate electrode material, a metrology tool for measuring a sheet resistance of the doped layer of gate electrode material and a controller for adjusting at least one parameter of at least one process operation if the measured sheet resistance of the doped layer of gate electrode material does not fall within acceptable limits.

In another illustrative embodiment, the system comprises a furnace for performing at least one heating process to introduce dopant atoms into a doped layer of gate electrode material by a diffusion process, a metrology tool for measuring a sheet resistance of the doped layer of gate electrode material and a controller for adjusting at least one parameter of the at least one heating process if the measured sheet resistance of the doped layer of gate electrode material does not fall within acceptable limits.

In yet another illustrative embodiment, the system comprises an ion implant tool for performing at least one ion implant process operation to form a doped layer of gate electrode material, a metrology tool for measuring a sheet resistance of the doped layer of gate electrode material and a controller for adjusting at least one parameter of the at least one ion implant process operation if the measured sheet resistance of the doped layer of gate electrode material does not fall within acceptable limits.

In a further illustrative embodiment, the system comprises a deposition tool adapted to perform a deposition process while dopant atoms are introduced into the deposition tool to thereby form a doped layer of gate electrode material, a metrology tool for measuring a sheet resistance of the doped layer of gate electrode material and a controller for adjusting at least one parameter of the deposition process if said measured sheet resistance of the doped layer of gate electrode material does not fall within acceptable limits.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
    performing at least one diffusion process operation by performing a first heat treatment process to diffuse a dopant material into an undoped layer of gate electrode material to thereby form a doped layer of gate electrode material;
    after said first heat treatment process is performed, performing a second heat treatment process to drive said dopant material into said doped layer of gate electrode material;
    measuring a sheet resistance of said doped layer of gate electrode material; and
    adjusting at least one of a duration and a temperature of at least one of said first heat treatment process and said second heat treatment process of said at least one diffusion process if said measured sheet resistance does not fall within acceptable limits.

2. The method of claim 1, wherein performing said at least one diffusion process operation to form a doped layer of gate electrode material comprises performing said at least one diffusion process operation to form a doped layer of gate electrode material comprised of polysilicon.

3. The method of claim 1, wherein measuring said sheet resistance of said doped layer of gate electrode material comprises measuring said sheet resistance of said doped layer of gate electrode material at a plurality of locations.

4. The method of claim 1, wherein measuring said sheet resistance of said doped layer of gate electrode material comprises measuring said sheet resistance of said doped layer of gate electrode material using a four-point probe.

5. A method, comprising:
    performing at least one ion implant process operation to implant ions of a single type into an undoped layer of gate electrode material to thereby form a doped layer of gate electrode material;
    measuring a sheet resistance of said doped layer of gate electrode material;
    adjusting at least one parameter comprising at least one of a dose and an implant energy of said at least one ion implant process if said measured sheet resistance does not fall within acceptable limits; and
    performing an anneal process after said at least one ion implant process is performed.

6. The method of claim 5, further comprising performing said ion implant process operation with said adjusted at least one parameter on a subsequently processed substrate to form a doped layer of gate electrode material above said subsequently processed substrate.

7. The method of claim 5, wherein performing said at least one ion implant process operation to form a doped layer of gate electrode material comprises performing at least one ion implant process operation to form a doped layer of gate electrode material comprised of polysilicon.

8. The method of claim 5, wherein measuring said sheet resistance of said doped layer of gate electrode material comprises measuring said sheet resistance of said doped layer of gate electrode material at a plurality of locations.

9. The method of claim 5, wherein measuring said sheet resistance of said doped layer of gate electrode material comprises measuring said sheet resistance of said doped layer of gate electrode material using a four-point probe.

10. A method, comprising:
performing at least one deposition process in a deposition chamber while introducing dopant material therein to form a doped layer of gate electrode material;
measuring a sheet resistance of said doped layer of gate electrode material; and
adjusting at least one parameter of said at least one deposition process if said measured sheet resistance does not fall within acceptable limits.

11. The method of claim 10, further comprising performing said deposition process operation with said adjusted at least one parameter on a subsequently processed substrate to form a doped layer of gate electrode material above said subsequently processed substrate.

12. The method of claim 10, wherein performing said at least one deposition process operation to form a doped layer of gate electrode material comprises performing said at least one deposition process operation to form a doped layer of gate electrode material comprised of polysilicon.

13. The method of claim 10, wherein measuring said sheet resistance of said doped layer of gate electrode material comprises measuring said sheet resistance of said doped layer of gate electrode material at a plurality of locations.

14. The method of claim 10, wherein measuring said sheet resistance of said doped layer of gate electrode material comprises measuring said sheet resistance of said doped layer of gate electrode material using a four-point probe.

15. The method of claim 10, wherein adjusting said at least one parameter of said at least one deposition process if said measured sheet resistance does not fall within acceptable limits comprises adjusting at least one of a temperature, a pressure, a duration, a process gas composition, a dopant source gas composition, a process gas flow rate and a dopant source gas flow rate if said measured sheet resistance does not fall within acceptable limits.

* * * * *